(12) United States Patent
Hirler et al.

(10) Patent No.: US 8,916,909 B2
(45) Date of Patent: Dec. 23, 2014

(54) SEMICONDUCTOR DEVICE AND METHOD FOR FABRICATING A SEMICONDUCTOR DEVICE

(75) Inventors: Franz Hirler, Isen (DE); Andreas Meiser, Sauerlach (DE)

(73) Assignee: Infineon Technologies Austria AG, Villach (AT)

( * ) Notice: Subject to any disclaimer, the term of this patent is extended or adjusted under 35 U.S.C. 154(b) by 37 days.

(21) Appl. No.: 13/413,315

(22) Filed: Mar. 6, 2012

(65) Prior Publication Data

US 2013/0234145 A1 Sep. 12, 2013

(51) Int. Cl.
*H01L 29/739* (2006.01)

(52) U.S. Cl.
USPC .................................. 257/195; 257/E27.014

(58) Field of Classification Search
CPC .................. H01L 27/14632; H01L 27/14687; H01L 27/14689; H01L 21/8249; H01L 27/0623; H01L 27/1203
USPC .......................................... 257/195, E27.014
See application file for complete search history.

(56) References Cited

U.S. PATENT DOCUMENTS

| | | | |
|---|---|---|---|
| 4,940,672 A | 7/1990 | Zavracky | |
| 7,420,226 B2 | 9/2008 | Augustine et al. | |
| 7,994,550 B2 * | 8/2011 | Kaper et al. | 257/289 |
| 2005/0040474 A1 * | 2/2005 | Shum | 257/390 |
| 2008/0070355 A1 * | 3/2008 | Lochtefeld et al. | 438/172 |
| 2009/0321794 A1 * | 12/2009 | Kim et al. | 257/255 |
| 2011/0049568 A1 * | 3/2011 | Lochtefeld et al. | 257/190 |
| 2013/0126884 A1 * | 5/2013 | Romano et al. | 257/76 |

OTHER PUBLICATIONS

J.W. Chung et al., "GaN-on-Si Techology, A new approach for advanced devices in energy and communications" Solid-State Device Research Conference (ESSDERC), 2010 Proceedings of the European, Sep. 14-16, 2010, pp. 52-56.
R. Dimitrov et al., "Comparison of N-face and Ga-face AlGaN/GaN-Based High Electron Mobility Transistors Grown by Plasma-Induced Molecular Beam Epitaxy", Jpn. J. Appl. Phys., 38 (Jun. 8, 1999) pp. 4962-4968.
Wataru Saito et al., "Demonstration of 13.56-MHz Class-E Amplifier Using a High-Voltage GaN Power-HEMT" IEEE Electron Device Letters, vol. 27, No. 5, May 2006, pp. 326-328.

* cited by examiner

*Primary Examiner* — S. V. Clark
*Assistant Examiner* — Ali Naraghi
(74) *Attorney, Agent, or Firm* — Dicke, Billig & Czaja, PLLC

(57) ABSTRACT

A semiconductor device is disclosed. In one embodiment, the semiconductor device includes two different semiconductor materials. The two semiconductor materials are arranged adjacent one another in a common plane.

13 Claims, 14 Drawing Sheets

SEMICONDUCTOR DEVICE AND METHOD FOR FABRICATING A SEMICONDUCTOR DEVICE

BACKGROUND

The application relates to a semiconductor device. Semiconductor devices may be fabricated using various semiconductor technologies dependent on the particular semiconductor material. Some non-limiting examples of semiconductor technologies are silicon-based, Gallium arsenide-based (GaAs) and Gallium nitride-based. Some of these technologies may lend themselves for use in some potential applications more conveniently than in other potential applications. For example, GaN is a wide bandgap semiconductor material that has potential applications in high-speed high power transistor devices, SiC has potential application in diodes and Si has potential application for CMOS (Complementary Metal Oxide Semiconductor) circuits. A combination of technologies based on differing semiconductor materials may also be desirable for different parts of an application.

SUMMARY

A semiconductor device and method for fabricating a semiconductor device. In some embodiments, an electronic component includes two different semiconductor materials. The two semiconductor materials are arranged adjacent one another in a common plane.

BRIEF DESCRIPTION

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various example embodiments described herein may be combined with each other, unless specifically noted otherwise.

Figure 1:
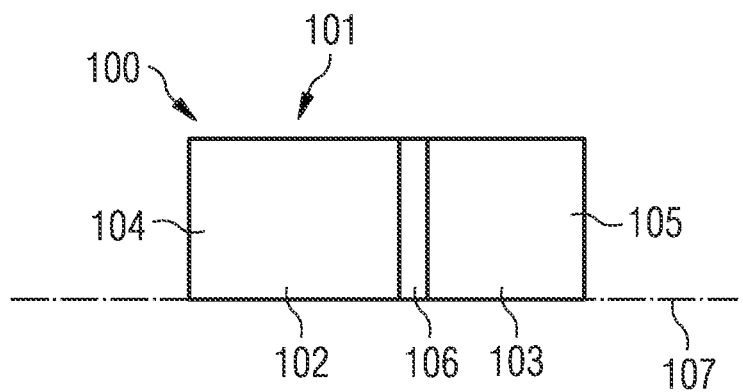
FIG. 1 illustrates the semiconductor device according to an embodiment.

FIG. 1 illustrates one embodiment of a semiconductor device 100. The semiconductor device 100 includes a body 101, a first portion 102 and a second portion 103. The first portion 102 and the second portion 103 are generally coplanar. The first portion 102 includes a first semiconductor material 104 having a first bandgap. The second portion 103 includes a second semiconductor material 105 having a second bandgap. The second bandgap of the second semiconductor material 105 has a different width compared to the first bandgap of the first semiconductor material 104.

The first semiconductor material 104 and the second semiconductor material 105 also have a different composition. For example, the first semiconductor material 104 may be a III-V semiconductor and the second semiconductor material 105 may be silicon. In one particular embodiment, the first semiconductor material 104 is gallium nitride and the second semiconductor material 105 is p-doped silicon.

The first portion 102 and the second portion 103 are positioned contiguous one another so that the first portion 102 and second portion 103 provide portions of a single body 101. The single body 101 is a common entity including two different semiconductor materials. The two semiconductor materials are arranged adjacent one another in a common plane 107. The body 101 can be considered as an integrated semiconductor device including two different semiconductor materials and two different semiconductor technologies.

The first portion 102 and the second portion 103 are electrically insulated from one another by a dielectric barrier 106 which is positioned at the interface or junction between the first portion 102 and the second portion 103. The dielectric barrier extends over the entire interface and provides a closed barrier between the two different semiconductor materials. The two different semiconductor materials are not in physical contact with one another.

Figure 2:
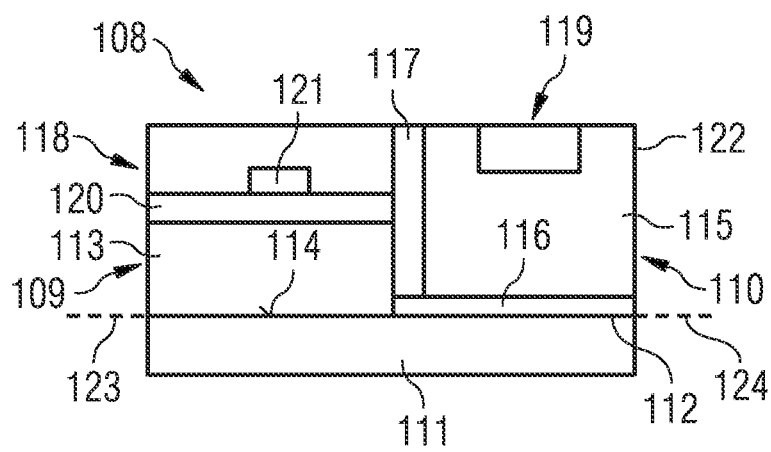
FIG. 2 illustrates a semiconductor device according to an embodiment.

FIG. 2 illustrates one embodiment of a semiconductor device 108, which includes a first portion 109 including gallium nitride and a second portion 110 including <100> silicon. The first portion 109 and the second portion 110 are arranged on a substrate 111, so that the interface 112 between the substrate 111 and the first portion 109 and the second portion 110 is coplanar. The first portion 109 and the second portion 110 are arranged adjacent one another on the substrate 111 and share a common interface with an upper surface 114 of the substrate 111 which is planar.

The first portion 109 may be considered to extend from a first rear plane 123 and the second portion 110 may be considered to extend from a second rear plane 124. The first rear plane 123 and the second rear plane 124 are coplanar with one another and contact an upper surface 114 of the substrate 111 and form the interface 112 between the substrate 111 and the first portion 109 and the second portion 110.

The substrate 111 may be electrically insulating. In one embodiment, the substrate 111 is <111> silicon. The substrate 111 may have the form of a <111> silicon wafer. In some embodiments, the substrate is sapphire or SiC or includes a <111> silicon layer grown on an insulating substrate such as glass.

The first portion 109 includes a gallium nitride layer 113 which is positioned directly in contact with the upper surface 114 of the substrate 111. The gallium nitride layer 113 is epitaxially arranged on the upper surface 114 of the substrate 111 and may be called an epilayer.

The second portion 110 includes a <100> silicon layer 115 and an oxide layer 116 positioned between the <100> silicon layer 115 and the upper surface 114 of the substrate 111. The oxide layer 116 electrically insulates the <100> silicon layer 115 from the <111> silicon substrate 111.

The second portion 110 further includes a dielectric barrier 117 in the form of an oxide layer, which extends generally perpendicularly from the upper surface 114 of the substrate 111, and has at least one portion that borders on the gallium nitride layer 113 and the silicon layer 115. In one embodiment, the dielectric barrier 117 completely surrounds the <100> silicon layer 115 and laterally dielectrically insulates the <100> silicon layer 115 from the gallium nitride layer 113.

The first portion 109 includes a transistor 118. In one embodiment illustrated in FIG. 2, the transistor is a HEMT (High Electron Mobility Transistor). The second portion 110 includes a CMOS device indicated generally with reference number 119.

The first portion 109 further includes an aluminium gallium nitride layer 120 positioned on the gallium nitride layer 114 and a gate electrode 121 positioned on the gallium aluminium nitride layer 120. This structure provides the HEMT.

In some embodiments the gate electrode 121 is positioned on the gallium aluminium nitride layer 120. In some embodiments, the gate electrode is positioned in a recess positioned in a surface of the gallium aluminium layer 120 opposing the gallium nitride layer. The gallium aluminium layer 120 may be selectively etched in the region selected for the gate electrode and the gate electrode is deposited into this recess. This arrangement of the gate electrode may be called a recessed gate electrode.

High Electron Mobility Transistors (HEMTs) have a source, a gate and a drain behave much like Field Effect Transistors (FET's). A conducting channel between the drain and source electrodes can be affected by applying a voltage to the gate electrode. This causes modulation of the drain-source current. In a HEMT, the conducting channel is created by a hetero structure, which in the example illustrated in FIG. 2 is provided by the GaN layer 113 and the AlGaN layer 120. The hetero-structure confines the charge carriers to a thin layer at the junction between the GaN layer 113 and the AlGaN layer 120 forming a 2 dimensional electron gas (2 DEG). The concentration of the carriers and their speed in this layer enables the transistor to maintain a high gain at very high frequencies.

In one or more embodiments, the HEMT structure can be formed from AlGaN/GaN using chemical vapor deposition (CVD), molecular beam epitaxy (MBE) or organometallic molecular vapor phase epitaxy (OMVPE). AlGaN/GaN materials have high transconductance (which helps linearity), good thermal management and high cutoff frequencies. The HEMT structure can be grown using CVD or metal organic CVD (MOCVD). Other CVD methods include atmospheric pressure CVD (APCVD), low pressure CVD (LPCVD), plasma enhanced CVD (PECVD), MBE and OMVPE.

Semiconductor device 108 includes a HEMT structure 118 and a CMOS device 119 fabricated with different semiconductor technologies which are integrated within a single body 122 providing a single semiconductor device on a single substrate. In one embodiment, the CMOS device 119 is configured as a driver for the HEMT 118.

The oxide layer 116 and the dielectric barrier 117 serve to electrically insulate the <100> silicon layer 112 and, in particular, the CMOS device 119 in the second portion 110 from the HEMT 118 in the first portion 109 of the single body 122 of the semiconductor device 108.

Figure 3:
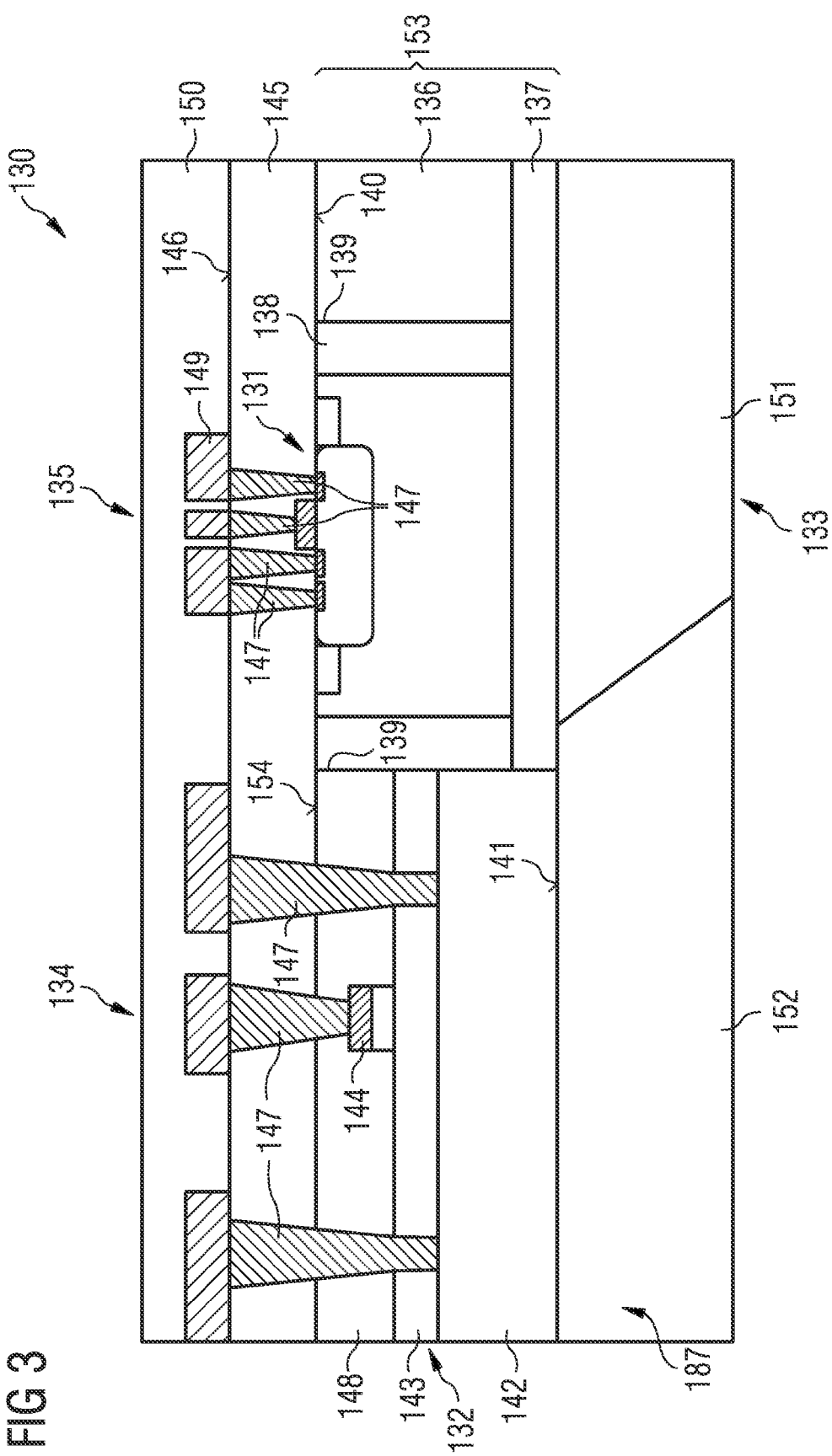
FIG. 3 illustrates a semiconductor device according to an embodiment.

FIG. 3 illustrates a semiconductor device 130 according to one embodiment. The semiconductor device 130 includes a CMOS device 131 and a HEMT 132 structure integrated within a single component. The semiconductor device 130 includes a substrate 133, which supports a first region 134, in which the HEMT structure 132 is positioned and an adjoining second region 135, in which the CMOS device 131 is positioned.

The second region 135 includes a <100> silicon layer 136. An oxide layer 137 is positioned on the substrate 133 between the <100> silicon layer 136 and the substrate 133. The CMOS device 131 is laterally surrounded by a dielectric barrier 138 in the form of a trench 139. The trench 139 extends from the upper surface 140 of the <100> silicon layer 136 in directions generally perpendicular to the upper surface 140 of the <100> silicon layer 136 and generally perpendicular to the upper surface 141 of the substrate 133. At least a portion of the trench 139 is positioned directly between the <100> silicon layer 136 and the HEMT structure 132 to provide electrical insulation of the CMOS device from the HEMT structure 132.

The trench 139 may be lined, partially filled or completely with an oxide layer or dielectric material to increase the lateral electrical insulation between the CMOS device 131 and the HEMT structure 132. The trench 139 may be filled completely with dielectric material in order to increase the mechanical stability of the arrangement. The trench 139 may also be lined, partially filled or filled with two or more oxide layers or two or more dielectric materials.

The first region 134 includes a gallium nitride layer 142, which is in direct contact with the upper surface 141 of the substrate 133 and is bounded by a side face of the oxide layer 136 and a side face of the trench structure 139 on at least one side. A aluminium gallium nitride layer 143 is positioned on the gallium nitride layer 142 and a gate electrode 144 is positioned on the aluminium gallium nitride layer 143.

The semiconductor device 130 further includes an oxide layer 148 which covers the first region 134 but not the second region 135. The oxide layer 148 covers the gate electrode 144 and the aluminium gallium nitride layer 143 and has a thickness such that its upper surface 154 is coplanar with the upper surface 140 of the <100> silicon layer 136. The semiconductor device 130 includes a second oxide layer 145 which entirely covers the first region 134 and the second region 135. The second oxide layer 145 is positioned on the oxide layer 148 and the <100> silicon layer 136. The second oxide layer 145 has an upper surface 146 which is planar. The second oxide layer 145 acts as a planarization layer. A plurality of through contacts 147 are positioned in the second oxide layer 145. A proportion of the plurality of through contacts 147 extend to the gate electrode 144 and to the gallium nitride layer 142 to provide connections to the source and drain of the HEMT structure 132. A proportion of the plurality of through contacts 147 extend to contacts of the CMOS device 131.

The through contacts 147 to the HEMT structure 132 may be fabricated at least in part in an additional process separate from the process to fabricate the through contacts 147 to the CMOS device 131. The through contacts 147 to the HEMT structure 132 extend through two oxide layers 145, 148 and have a higher aspect ratio than the through contacts for CMOS device 131 which extend through only a single oxide layer 145. The lateral area providing the base of the through contacts 147 is larger for the HEMT structure 132 than for the CMOS device 131.

A rewiring metallisation structure 149 is positioned on the oxide layer 145 and is covered with a protective oxide layer 150. The rewiring metallisation structure 149 may connect the HEMT structure 132 with the CMOS device 131. The rewiring metallisation structure 149 may extend to non-illustrated external contact pads of the semiconductor device 130.

The substrate 133 includes two regions 151 and 152 positioned adjacent one another in a common plane. The substrate 133 may include two different materials arranged laterally separately from one another. The first substrate region 151 is in direct contact with the oxide layer 136 only and includes <111> silicon. The second substrate region 152 is in direct contact with the gallium nitride layer 142 only. The second substrate region 152 includes an insulation material, such as an oxide.

The second substrate region 152 of the substrate 133 including an insulation material can be considered as based on a trench structure and is produced towards the end of the process to fabricate the semiconductor device 130.

At the start of the process to produce the semiconductor device 130, the <111> silicon layer extends over the entire lateral extent of the semiconductor device 130. The gallium nitride layer 142 may be epitaxially grown on the upper surface of <111> silicon layer.

After the fabrication of the HEMT 132 and CMOS device 131, portions of the <111> silicon wafer may be removed to expose portions of the gallium nitride layer 142. These exposed portions of the gallium nitride layer 142 form the base of wide area trenches or indentations in the <111> silicon layer. These wide area trenches or indentations are subsequently lined, and may be filled, with insulating material, such as an oxide, which also acts as a protective layer for the gallium nitride.

The semiconductor device 130 includes a substrate 133 having discrete regions of differing composition rather than a single composition that extends to the outermost edges of the semiconductor device 130.

The semiconductor device 130 includes a layered structure in which the substrate 133 includes two different materials which are positioned in regions laterally adjacent one another. The semiconductor device includes an active layer 153 including the HEMT structure and the CMOS devices fabricated in two different semiconductor materials which are positioned in regions laterally adjacent one another. The upper surface 141 of the substrate 133 includes two different materials; <111> silicon and an oxide. The upper surface 141 builds an interface with the active layer 153 includes two differing semiconductor materials.

In some embodiments, neither the substrate 133, nor the active layer 153 includes a single material which extends to all of the outermost edges of the semiconductor device 130. Only the oxide layer 145 and the protective oxide layer 150 are continuous in the sense that they extend over both the first region 134 and the second region 135 including differing semiconductor materials and different substrate materials and extend to all of the outermost edges of the semiconductor device 130.

In some embodiments, the substrate includes a single material which extends to all of the outermost edges of the semiconductor device, whereas the active layer fails to include a single material which extends to all of the outermost edges of the semiconductor device. In these embodiments, the substrate may be sapphire, for example. However, the substrate may also comprise silicon.

Embodiments for fabricating a semiconductor device including a CMOS device and a HEMT structure will now be described.

Figure 4:
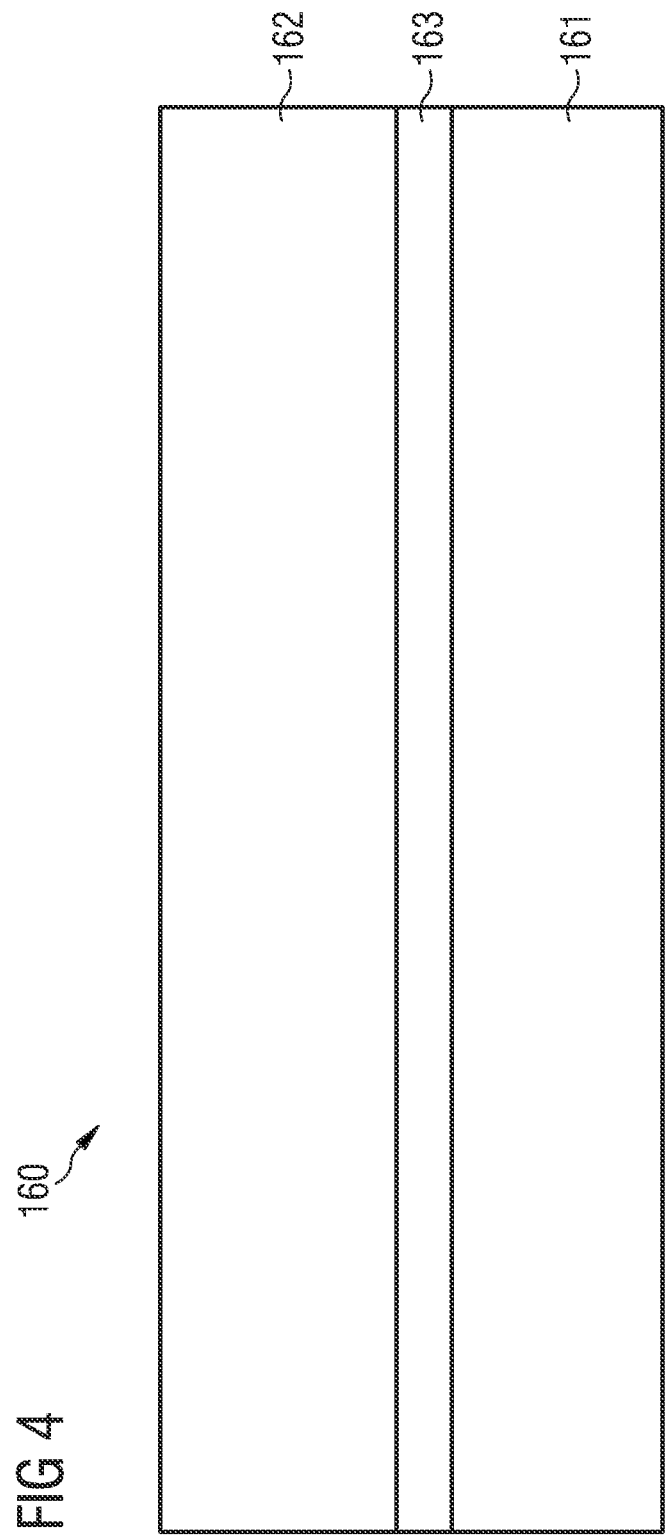
FIG. 4 illustrates a multilayer structure including a <111> silicon wafer bonded to a <100> silicon wafer.

FIG. 4 illustrates one embodiment of a multilayer structure 160 including a <111> silicon wafer 161 bonded to a <100> silicon wafer 162 via an oxide layer 163 positioned between them. The <100> silicon wafer 162 may be used for the fabrication of a CMOS device. The <111> silicon wafer 161 may be used as a substrate which is capable of supporting epitaxial growth of gallium nitride. Other possible substrates which support the epitaxial growth of gallium nitride are sapphire, silicon carbide and <111> silicon layer on glass which may be used in place of <111> silicon wafer 161.

In some embodiments, after the bonding of the <111> silicon wafer 161 to a <100> silicon wafer 162 via an oxide layer 163, the <111> silicon wafer may, be thinned by mechanical or chemical mechanical polishing, for example. In these embodiments, the <100> silicon wafer acts as a support wafer for the <111< silicon wafer during the thinning process.

Figure 5:
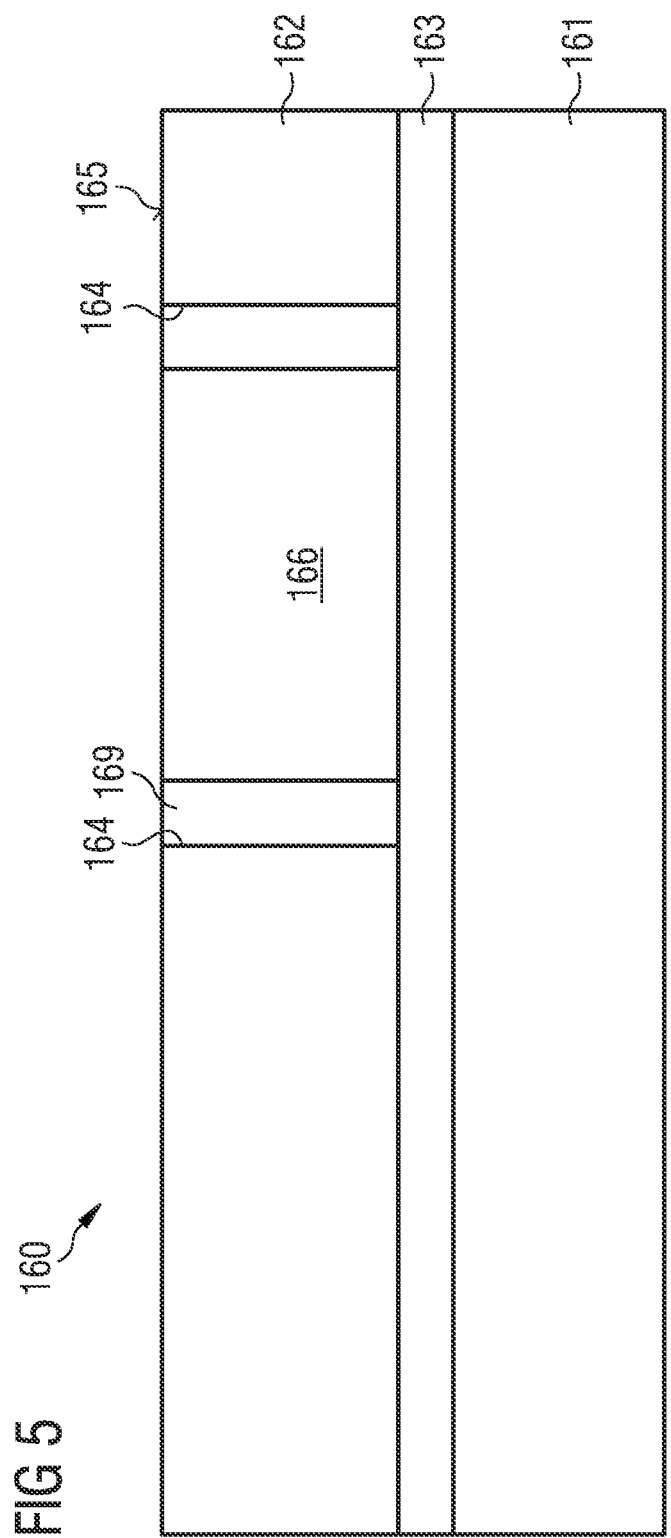
FIG. 5 illustrates an embodiment including a trench in a surface of a <100> silicon wafer.

FIG. 5 illustrates one embodiment of a trench 164 formed by etching from the outer surface 165 of the <100> silicon wafer 162. The trench 164 extends through the thickness of the <100> silicon wafer 162 to the oxide layer 163 which provides the base of the trench 164. The trench 164 may be positioned so as to completely surround the lateral periphery of a portion 166 of the <100> silicon wafer 162 in which the CMOS structure is to be fabricated. The trench 164 may have a continuous uninterrupted ring-shape when viewed from above.

The portion 166 is also electrically insulated over the <111> silicon substrate by the oxide layer 163 positioned between the <100> silicon wafer 162 and the <111> silicon wafer 161. The trench 164 may be lined, partially filled or completely filled with a dielectric material 169 to further increase the electrical isolation of the portion 166. The dielectric coating positioned in the trench 164 may be oxide, for example.

Figure 6:
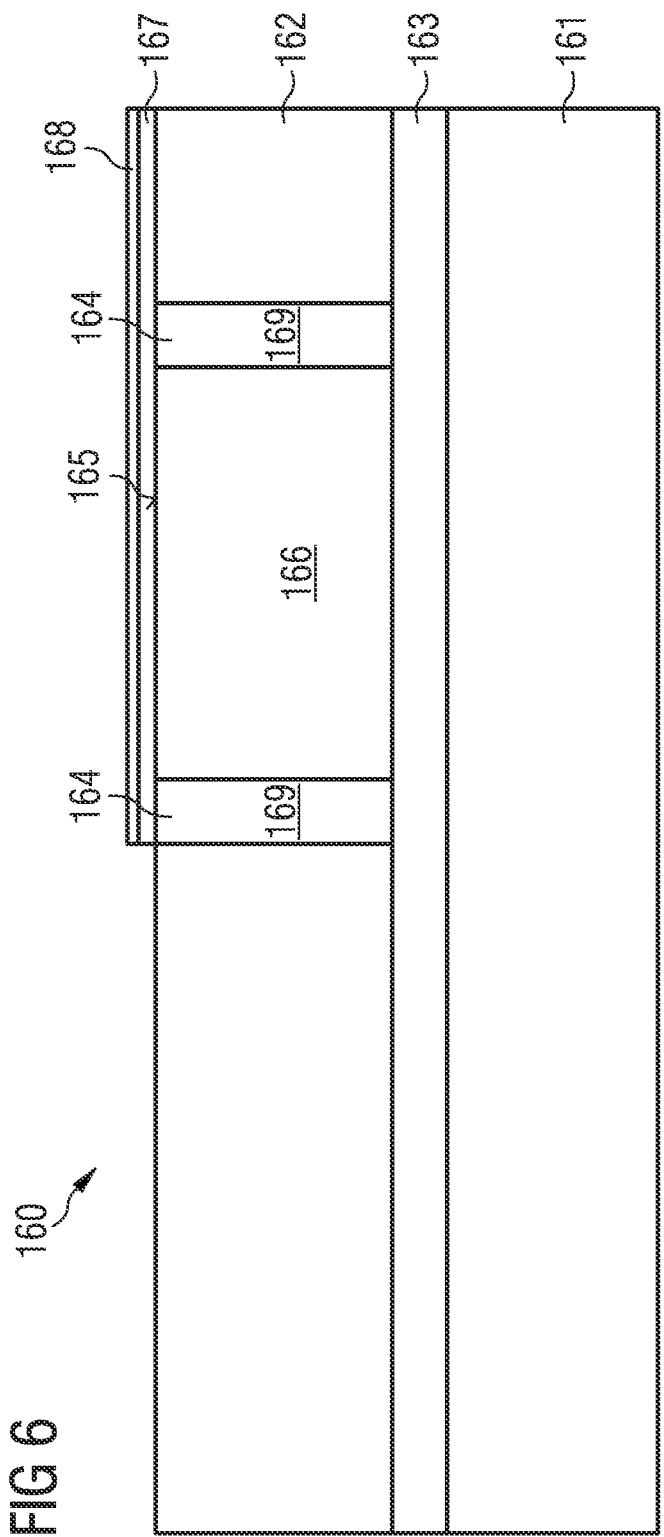
FIG. 6 illustrates an embodiment including an oxide layer.

FIG. 6 illustrates one embodiment of an oxide layer 167 deposited on the portion 166 and trenches 164. The oxide layer 167 may also cover all regions of the device in which CMOS structures are desired. A nitride layer 168 is deposited onto the oxide layer 167 has a lateral extent corresponding to the lateral extent of the oxide layer 167. The oxide layer 167 and the nitride layer 168 may be structured by applying a structured photolithographic layer as a mask in regions in which a CMOS device is desired. Portions of the oxide layer 167 and of nitride layer 168 in regions in which a HEMT is desired are selectively removed.

In some embodiments, the nitride layer 168 may be omitted.

Regions of the <100> silicon wafer 162, which remain uncovered by the oxide layer 167 and the nitride layer 168, are removed by etching, followed by an oxide etch to remove portions of the oxide layer 163 positioned adjacent and outside of the nitride covered regions of the <100> silicon substrate 162 and to provide one or more first regions 170.

Figure 7:
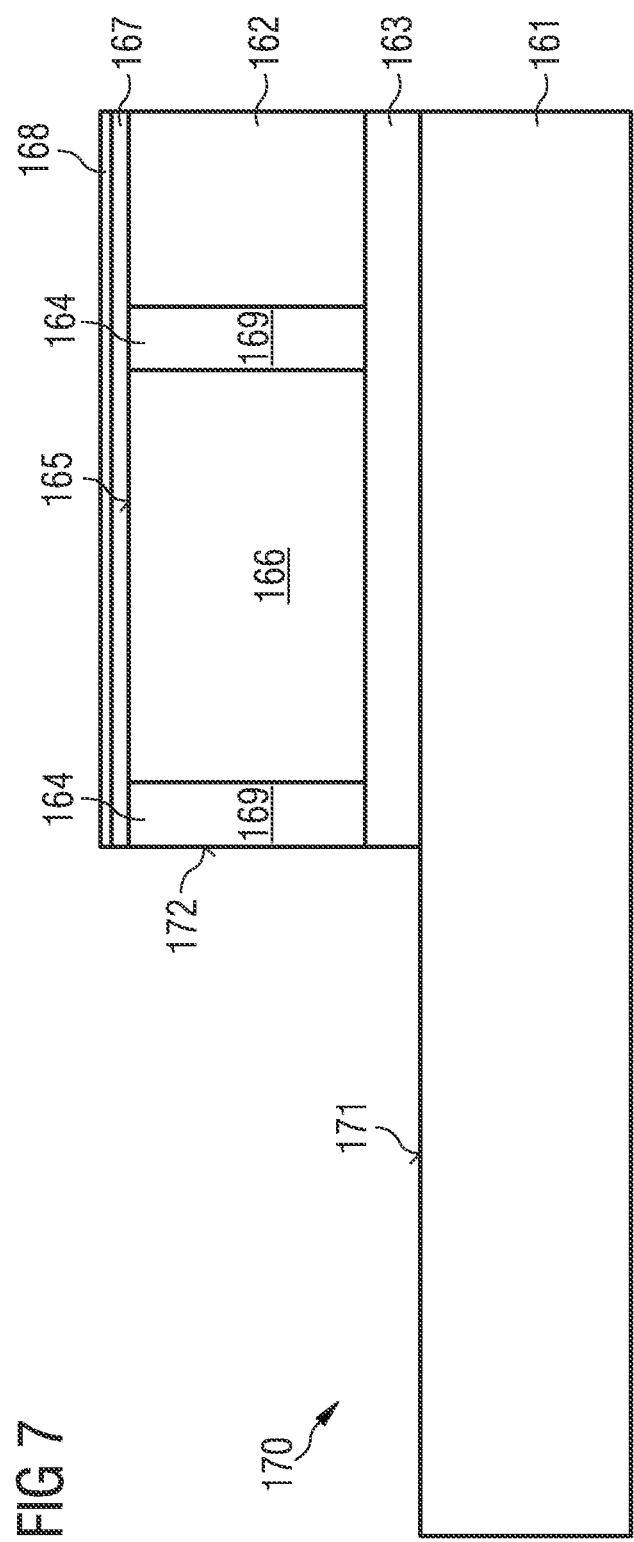
FIG. 7 illustrates an embodiment including a first region in which an upper surface of a <111> silicon wafer is exposed.

FIG. 7 illustrates one embodiment that, in the first region 170, the upper surface 171 of the <111> silicon wafer 161 is exposed leaving protruding portions of the <100> silicon wafer which are bonded to the <111> silicon wafer 161 by the oxide layer 163. These protruding portions may be discrete islands or have the form of a connected network. They may be symmetrically or asymmetrically distributed over the device. The outermost side surface 172 of the oxide filled trench 164 is also exposed.

In some embodiments, the nitride layer 168 may be removed.

Figure 8:
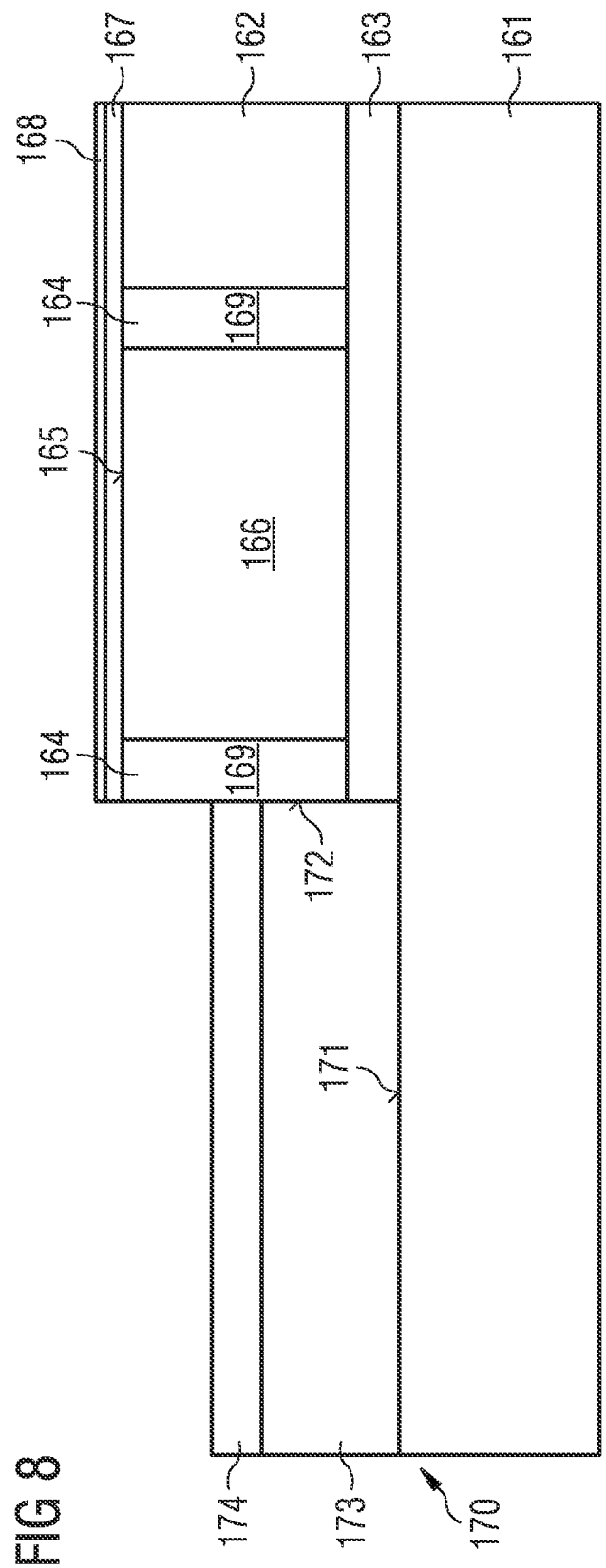
FIG. 8 illustrates an embodiment including a gallium nitride layer and an aluminium gallium nitride layer.

FIG. 8 illustrates one embodiment of the selective deposition of a gallium nitride layer 173 directly on the surface 171 of the <111> silicon wafer 161 in the first region 170. An aluminium gallium nitride layer 174 is deposited on the gallium nitride layer. Since gallium nitride can be epitaxially grown on <111> silicon, the gallium nitride layer 173 and the aluminium gallium nitride layer 174 are epitaxial layers. GaN and AlGaN are not deposited on the nitride layer 168 or, if the nitride layer 168 has been removed or omitted, on the oxide layer 167.

Figure 9:
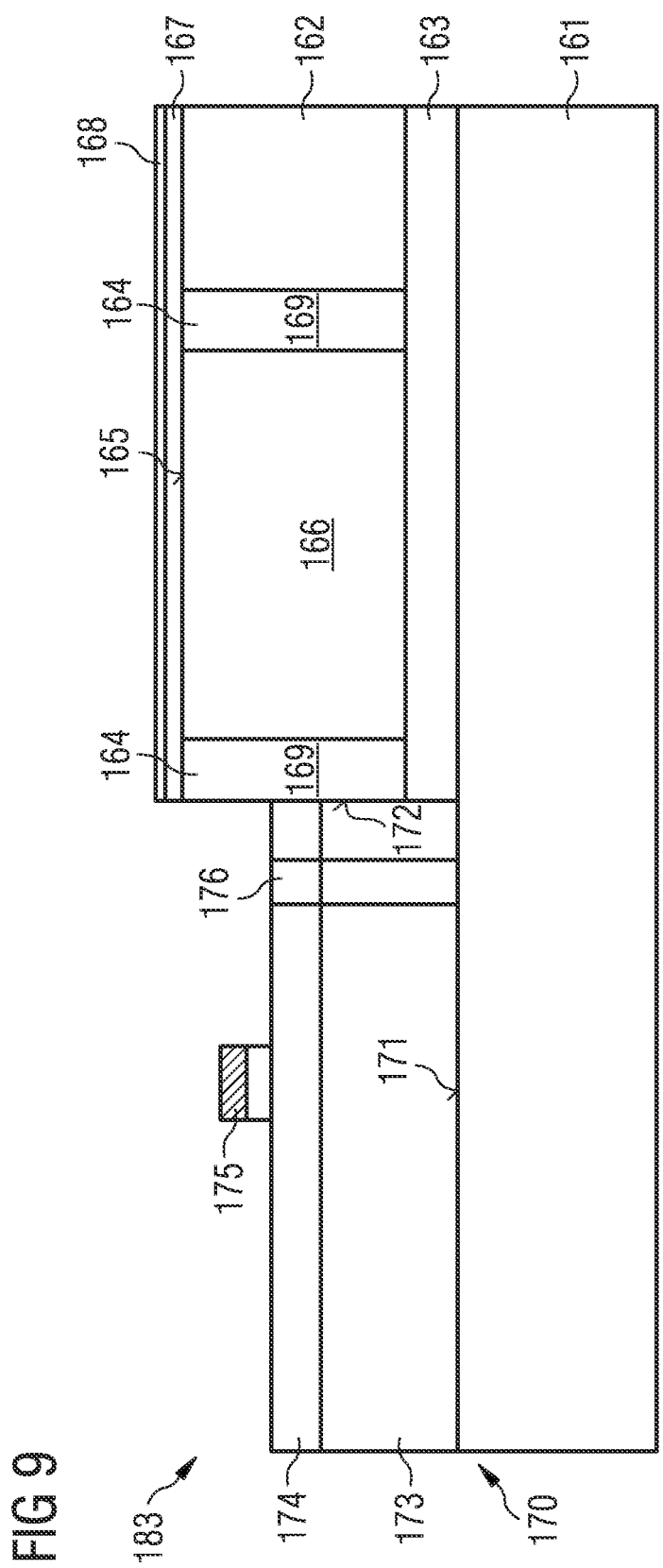
FIG. 9 illustrates an embodiment including a gate electrode on a aluminium gallium nitride layer.

FIG. 9 illustrates one embodiment of a gate electrode 175 which has been deposited on the aluminium gallium nitride layer 174. The gate is part of a transistor structure, in one embodiment a HEMT 183. The total height of the gallium nitride layer 173, the aluminium gallium nitride layer 174 and the gate 175 is less than the height of the <100> silicon layer 162.

Lattice damage may be introduced into a peripheral region of the aluminium gallium nitride layer 174 and gallium nitride layer 173 adjacent the region 166 including the CMOS device. A trench 176 of lattice damage may be introduced by implanting, for example, aluminium ions or hydrogen or helium. The trench 176 may provide additional lateral electrical isolation between the HEMT structure 183 and an adjacent CMOS device in region 166.

Figure 10:
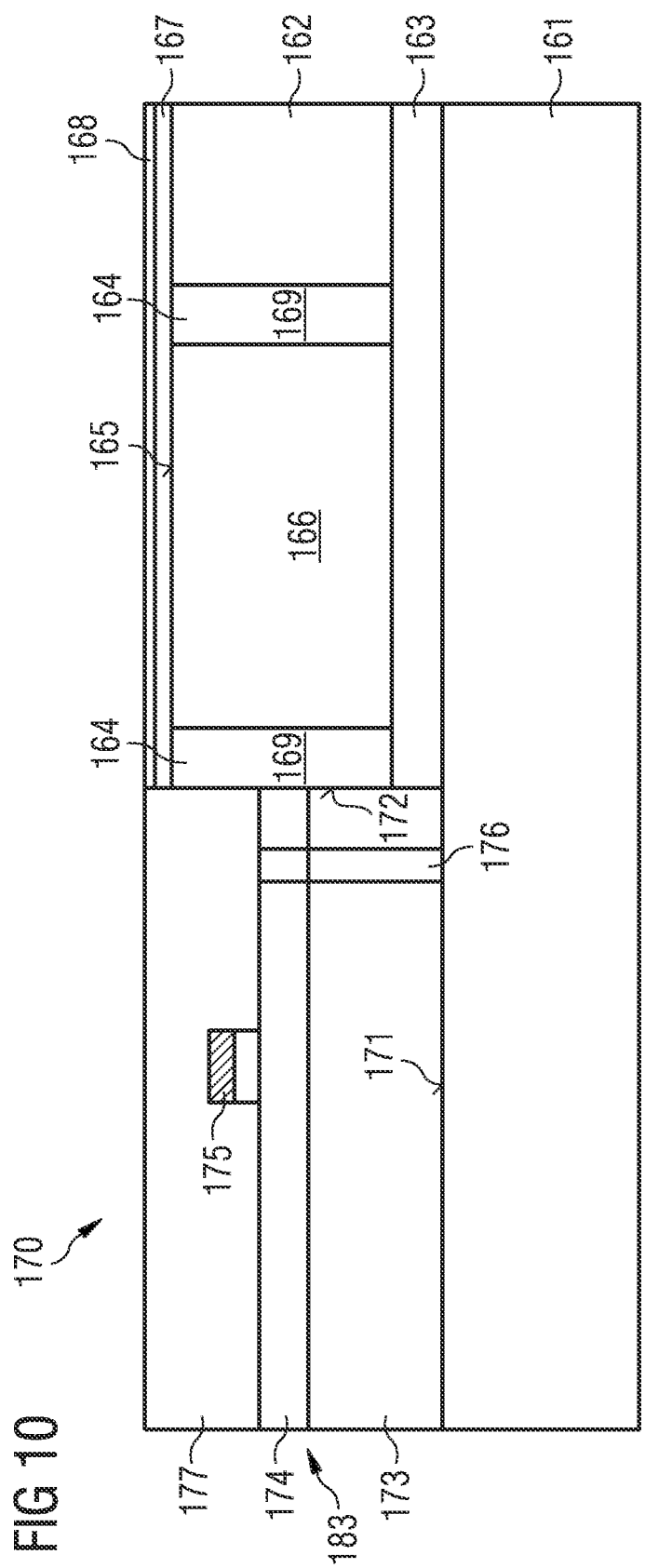
FIG. 10 illustrates an embodiment including an oxide layer over a gate electrode.

FIG. 10 illustrates in one embodiment an oxide layer 177 which has been deposited over the gate electrode 175 and the aluminium gallium nitride layer 174. This oxide layer 177 may be deposited over the whole structure including the first region 166 and then planarized, for example by means of chemical mechanical polishing, to reduce the thickness and provide a coplanar common surface between the upper surface of the oxide layer 177 and the nitride layer 168.

In various embodiments, in which the nitride layer 168 is omitted, the upper surfaces of the oxide layer and the <100> silicon layer 162 are coplanar.

Figure 11:
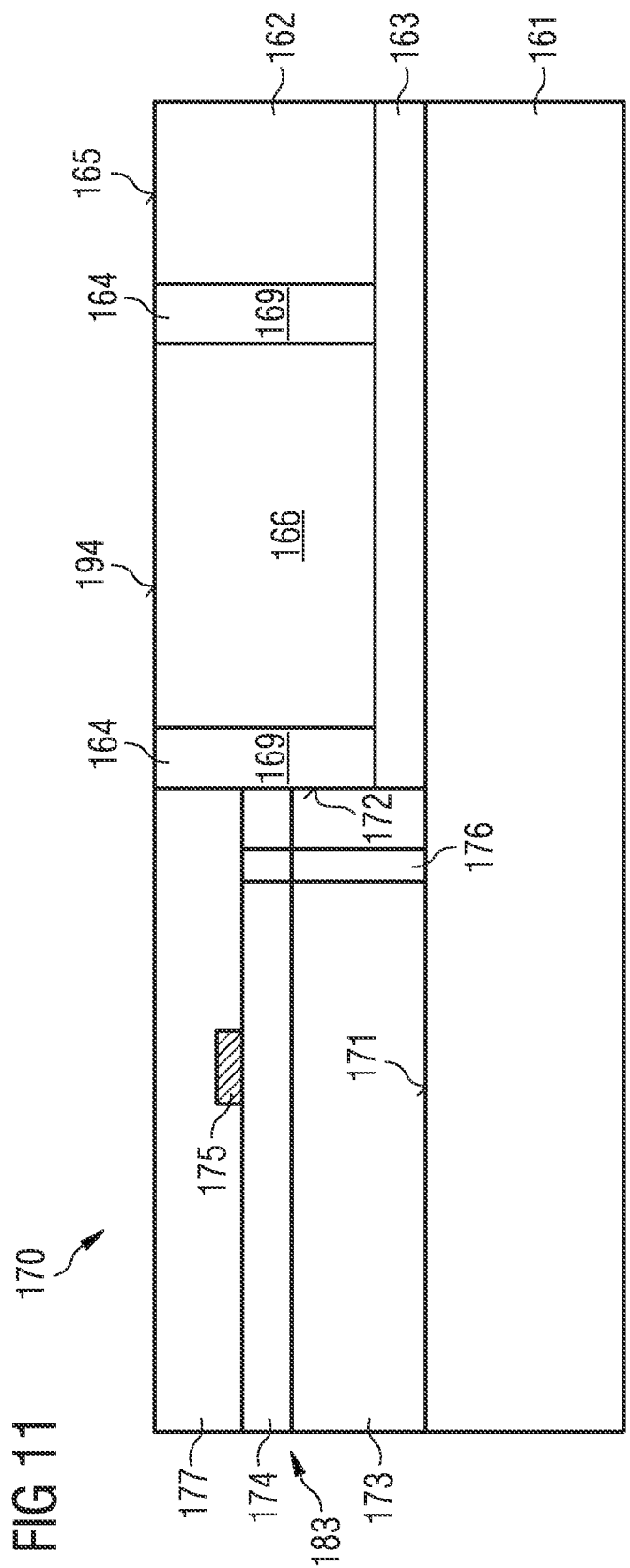
FIG. 11 illustrates a structure after removal of a nitride layer mask.

FIG. 11 illustrates one embodiment of the structure after the nitride layer 168 has been removed and the oxide layer 167 overlaying the <100> silicon layer 162 has been removed. A planar surface 194 including regions of the oxide layer 177, the trench 164 and the <100> silicon layer 162 is formed.

In some embodiments, the planar surface 194 may not be perfectly planar, but may include a step having a rise or height of less than 200 nm or less than 100 nm.

Figure 12:
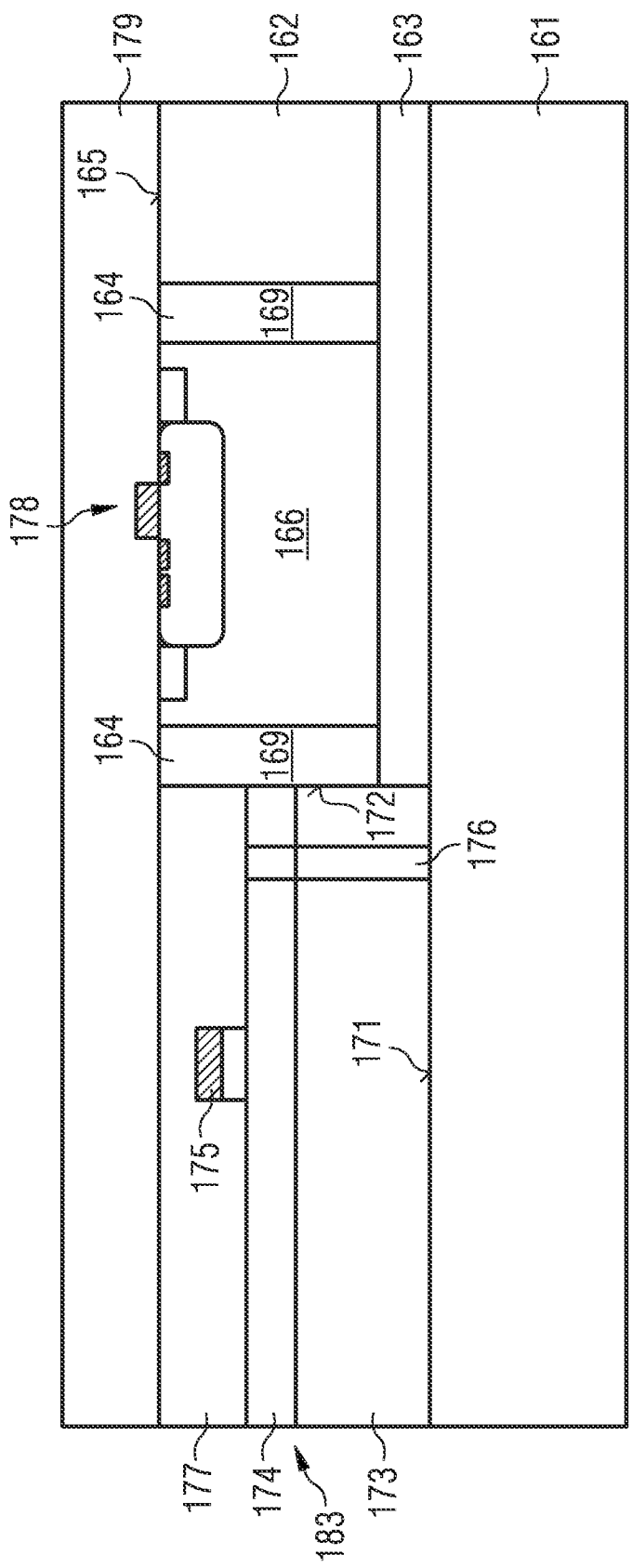
FIG. 12 illustrates an embodiment including a CMOS device.

FIG. 12 illustrates one embodiment of a CMOS device 178 which has been fabricated in the region 166. The CMOS device 178 is surrounded by the trench 164 and oxide layer 163 on five sides. An insulation layer 179 is then deposited over the whole of the structure covering the CMOS structure 178 and the oxide layer 177.

Figure 13:
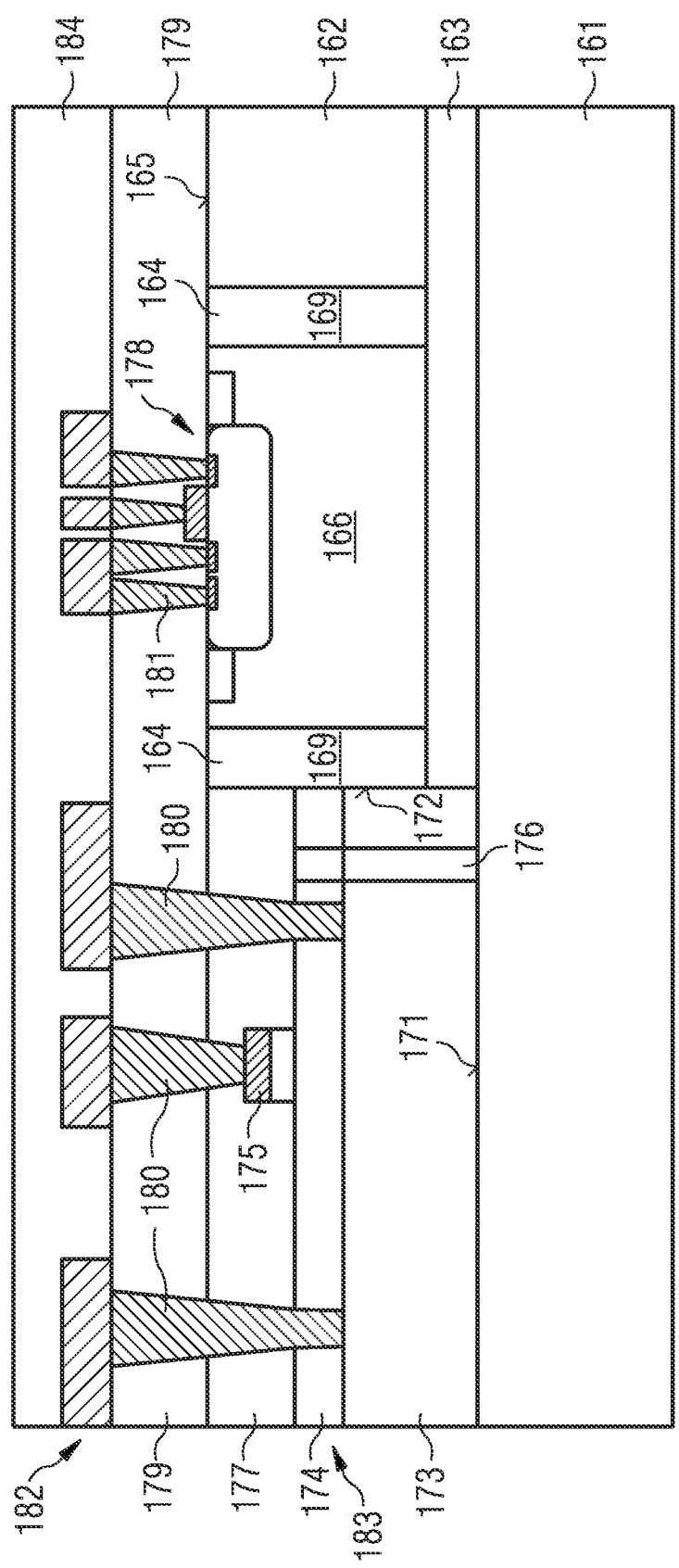
FIG. 13 illustrates an embodiment including through contacts.

FIG. 13 illustrates one embodiment of electrically conductive through contacts 180 through the insulation layer 179 and the oxide layer 177 which provide electrical contact to the underlying gallium nitride layer 174 and the gate electrode 175 of the HEMT structure 183. Through contacts 181 through the oxide layer 179 provide electrical contact to the CMOS device 178.

A metallisation 182 including one or more metal layers is deposited onto the oxide layer 179 and through contacts 181 and 182 either by using a mask or by deposition and subsequent structuring. The metallisation 182 provides a re-wiring structure which may be used to electrically connect the CMOS device 178 with the HEMT 183 and to provide rewiring to non-illustrated external contacts through which signals and voltages can be applied to the CMOS device 178 and the HEMT 183. The metallisation 182 may be covered, apart from those regions intended to form contact pads, by a passivation layer of an oxide layer 184 and/or a polyimide layer.

FIG. 13 illustrates one embodiment of a gallium nitride-based HEMT 183 and a silicon-based CMOS device 178 integrated into a single device 185 on a common substrate 161 at the wafer level.

In the embodiments described above, only one device position is discussed. A plurality of device positions may be processed at the same time to provide a plurality of semiconductor devices each having a HEMT and a CMOS device and all integrated into a single body positioned on a common substrate. This arrangement may be considered to be a wafer. Individual semiconductor devices including two different semiconductor materials may be singulated from the wafer.

Figure 14:
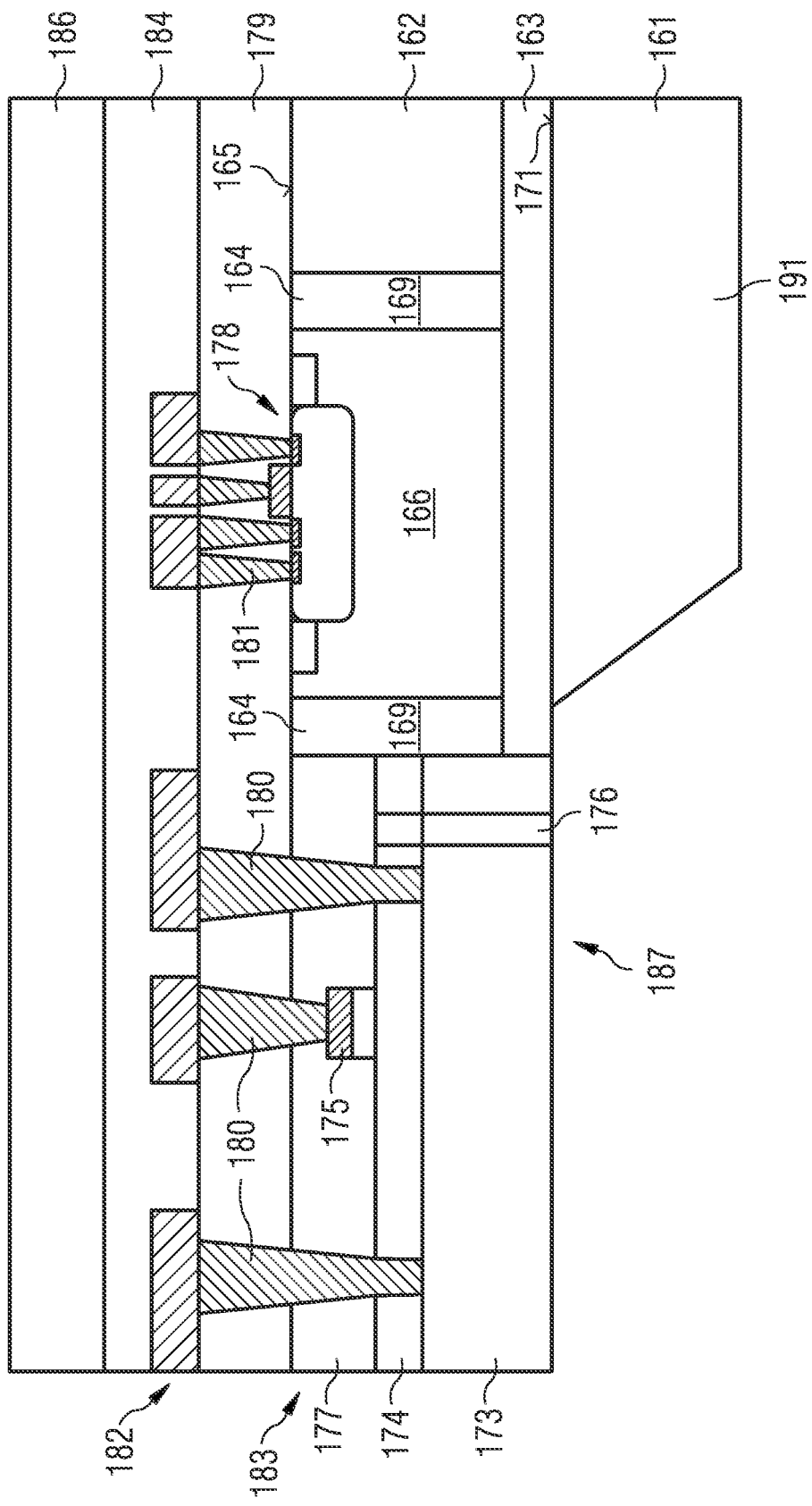
FIG. 14 illustrates an embodiment including a structured substrate.

FIG. 14 illustrates one embodiment in which the electrical insulation of the HEMT 183 of semiconductor device 185 may be increased. An increased electrical insulation of the HEMT 183 may be useful if the substrate includes <111> silicon.

A carrier 186 is attached to the passivation layer 184. The carrier may be glass, for example. Regions of the <111> silicon wafer 161, which are positioned adjacent the gallium nitride layer 173, are removed by etching. The regions of the <111> silicon wafer 161 contacting the oxide layer 163 are masked so as to prevent their removal during the etching process.

The portions 191 of the <111> silicon wafer 161 remaining after etching may have a continuous lattice type structure, including one or more discrete indentations 187, exposing the gallium nitride layer 173. In an embodiment, the HEMT 183 and CMOS device 178 are arranged such that the <111> silicon portions 191 remaining after the etch step is present in the form of one or more discrete regions or islands.

Figure 15:
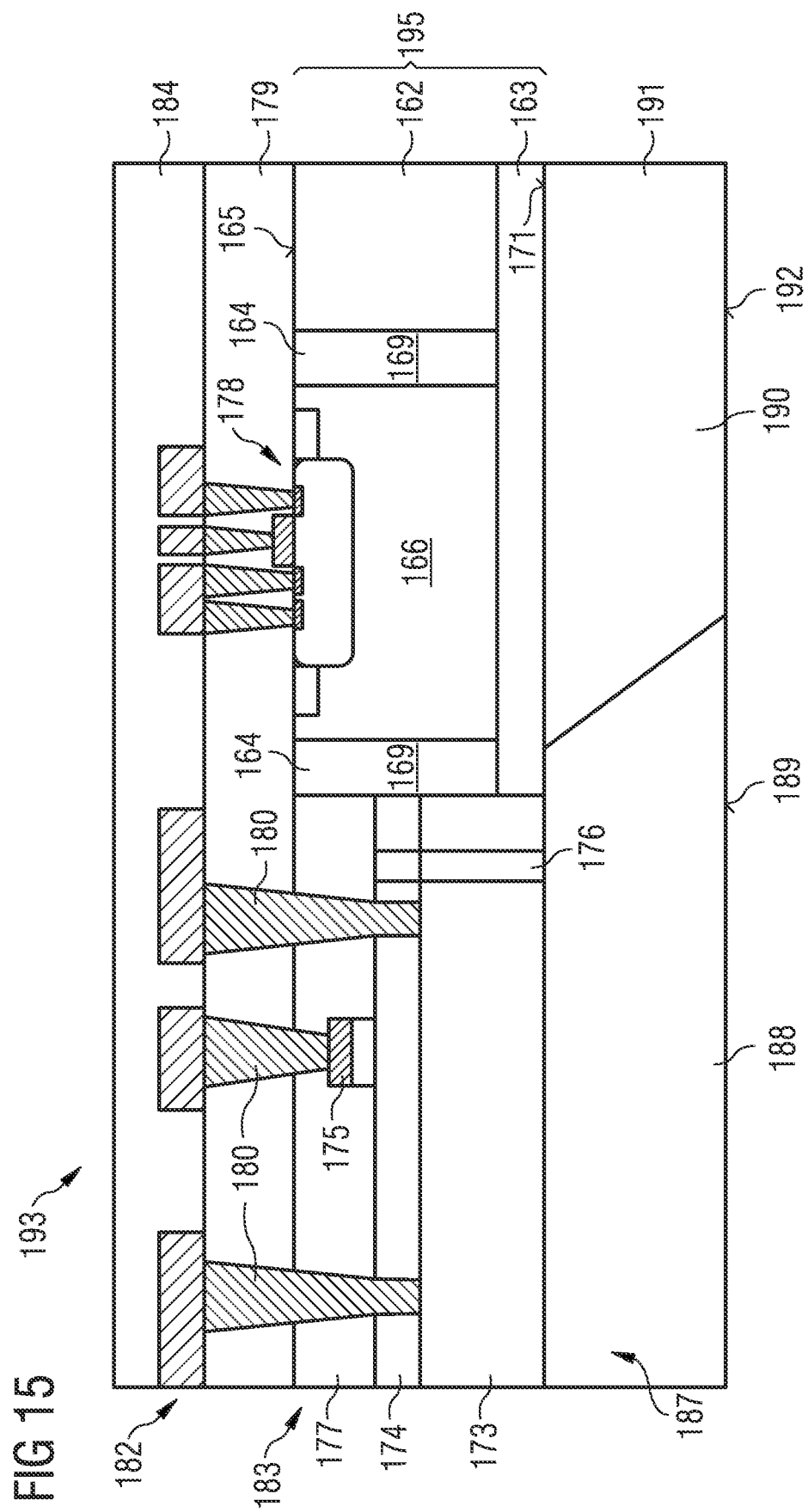
FIG. 15 illustrates an embodiment in which a HEMT is provided with further electrical insulation.

FIG. 15 illustrates one embodiment, in which the indentations 187 are filled with insulation material 188, for example, an oxide. In some embodiments, the indentations 187 may be coated with insulation material, so as to protect the gallium nitride and the <111> silicon. In some embodiments, the indentations 187 may be completely filled with insulation material 188, such that the outer surface 189 of the insulation material and the outer surface 190 of the remaining portions 191 of the <111> silicon wafer 161 are coplanar and lie in a common plane. The insulation material 188 may also aid in providing increased mechanical stability to the semiconductor device 193. The carrier 186 may be removed.

The through contacts 180 may be fabricated by methods known in the art. The though contacts may include a single electrically conductive material such as a metal. The through contacts may also have a multilayer structure which may be fabricated by depositing one or more layers which line the through holes in the oxide layer or layers. These layers may improve the adhesion of the through contacts to the surrounding oxide material. The centre portion of the through holes may then be filled with a further metal. A through contact may also be called a via.

The gallium nitride layer 173 and the <100> silicon layer 162 are present in the form of discrete blocks abutting one another which form a common layer 195 of the semiconductor device 193. The lower surfaces of the gallium nitride layer and the dielectric layer surrounding the silicon are coplanar as, during fabrication of the device, both these layers are positioned on the upper surface of the common <111> silicon wafer 161.

The CMOS devices and the silicon layer are not positioned over a substrate including a gallium nitride layer, which extends over the entire area of the device including to its outermost edges. The two different semiconductor materials are positioned adjacent and coplanar to one another, such that neither the gallium nitride layer, nor the <100> silicon layer extends over the entire device.

The gate may include a single electrically conductive layer. In some embodiments, the gate further includes a gate dielectric positioned between the electrically conductive layer and the aluminium gallium nitride layer.

Gallium nitride power switches, such as HEMTs may be attractive for applications in voltages of 20 to 1200 V due to their high critical field strength, small Ron and small footprint. For voltages in the range of 0.7 to 5V, silicon-based technology such as CMOS is useful. Combining both technologies at the wafer level as described herein may enable aspects of both types of technologies to be realised at the same time in a single body of a single semiconductor device. The embodiments described above enable gallium nitride power switches, such as HEMTs to be combined with silicon-based controllers and drivers at the wafer level due to the dielectric insulation provided by the dielectric barriers around the silicon regions thus electrically insulating them form the gallium nitride regions.

Additionally, these portions fabricated using two different technologies are provided such that they are coplanar with one another. This may aid in assisting the deposition of a conformal oxide layer onto regions of the wafer including two differing technologies such that a common dielectric layer can be used to form the basis of the rewiring structure.

In some embodiments, the HEMT structure is fabricated before the CMOS structure. This embodiment may be used in order to perform all the high-temperature steps before the CMOS structure is fabricated. This may help to avoid unwanted diffusion of the doped regions of the CMOS structure which may occur as a result of high processing temperatures.

As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a body comprising:
a first portion comprising a first semiconductor material having a first bandgap;
a second portion comprising a second semiconductor material having a second bandgap, the second bandgap being different from the first bandap; and
the first portion and the second portion being coplanar and dielectrically insulated from one another; and
wherein the body is disposed on a substrate with the first and second portions being laterally adjacent to one another on the substrate, wherein the substrate includes a first region and a second region laterally adjacent to one another, the first region below the first portion and comprising a first substrate material, and the second region below the second portion and comprising a second substrate material which is different from the first substrate material.

2. The semiconductor device according to claim 1, wherein the first portion comprises a HEMT structure.

3. The semiconductor device according to claim 1, wherein the second portion comprises a CMOS device.

4. The semiconductor device according to claim 1, wherein the first portion comprises a III-V semiconductor material.

5. The semiconductor device according to claim 1, wherein the first portion comprises a GaN layer, an AlGaN layer arranged on the GaN layer and a gate electrode positioned on the AlGaN layer.

6. The semiconductor device according to claim 1, wherein the second portion comprises <100> silicon.

7. The semiconductor device according to claim 1, further comprising a dielectric barrie arranged in an interface between the first portion and the second portion.

8. The semiconductor device according to claim 1, further comprising a <111> silicon layer positioned adjacent the second portion.

9. The semiconductor device according to claim 8, further comprising a dielectric positioned adjacent the first portion.

10. The semiconductor device according to claim 1, further comprising a dielectric layer positioned adjacent the first portion and the second portion.

11. The semiconductor device according to claim 1, wherein the second portion comprises <100> silicon, a <111> silicon layer is positioned adjacent the second portion and an oxide layer is arranged between the <111> silicon and the <100> silicon.

12. The semiconductor device according to claim 1, further comprising a re-wiring structure.

13. The semiconductor device of claim 1, wherein the first substrate material comprises an insulating material, such as an oxide, and the second substrate material comprises a silicon material.

* * * * *